United States Patent [19]
Vestberg et al.

[11] Patent Number: 5,158,707
[45] Date of Patent: Oct. 27, 1992

[54] CONDUCTIVE PLASTIC COMPOSITE AND ITS PREPARATION AND USE

[75] Inventors: Torvald Vestberg, Porvoo; Jukka Laakso, Helsinki; Jan-Erik Österholm, Porvoo; Ismo Lehtiniemi, Helsinki, all of Finland

[73] Assignee: Neste Oy, Kulloo, Finland

[21] Appl. No.: 588,698

[22] Filed: Sep. 27, 1990

[30] Foreign Application Priority Data

Oct. 5, 1989 [FI] Finland ................................ 894742

[51] Int. Cl.$^5$ .......................... H01B 1/00; H01B 1/06
[52] U.S. Cl. .................................. 252/500; 252/518; 252/519; 526/256
[58] Field of Search ........................ 252/500, 518, 519; 526/256

[56] References Cited

U.S. PATENT DOCUMENTS

| | | | |
|---|---|---|---|
| 4,604,427 | 8/1986 | Roberts et al. ...................... | 252/500 |
| 4,665,129 | 5/1987 | Naarmann et al. ................. | 252/518 |
| 4,691,005 | 9/1987 | Sato et al. ........................... | 252/500 |
| 4,824,871 | 4/1989 | Shinomura .......................... | 252/518 |
| 4,892,678 | 1/1990 | Tanaka et al. ...................... | 252/518 |
| 4,909,959 | 3/1990 | Lemaire et al. ..................... | 252/500 |

FOREIGN PATENT DOCUMENTS

| | | |
|---|---|---|
| 0054683 | 6/1982 | European Pat. Off. . |
| 0157257 | 10/1985 | European Pat. Off. . |
| 1173062 | 7/1989 | Japan . |
| 8901015 | 2/1989 | World Int. Prop. O. . |

Primary Examiner—Mark L. Bell
Assistant Examiner—Deborah Jones
Attorney, Agent, or Firm—Tilton, Fallon, Lungmus & Chestnut

[57] ABSTRACT

The invention relates to the homogenization of mixtures of internally conductive polymers like 3-substituted polythiophene and matrix polymers. With an efficient homogenization the conductivity is improved when the portion of the conductive polymer is low. An efficient homogenization is achieved in the invention by mixing the internally conductive polymer with a monomer or by dissolving it into it, after which the monomer is polymerized. The plastic composites so obtained are used for several purposes in which conductivity is needed, such as EMI and ESD shielding.

27 Claims, No Drawings

CONDUCTIVE PLASTIC COMPOSITE AND ITS PREPARATION AND USE

The invention relates to the homogenization of compositions comprising internally conductive and matrix polymers like 3-substituted polythiophene.

More closely, the invention relates to a conductive plastic composite consisting of a matrix polymer, an internally conductive, doped polymer and optionally one or several plastic additives. The invention also relates to the use of this kind of conductive plastic composite and to the preparation thereof.

Conductive polymers constitute a group of materials subject to intensive research world-wide. These materials provide a possibility to replace metal conductors and semi-conductors in many applications, such as batteries, light cells, printed circuit boards, antistatic shields (ESD), and electromagnetic interference (EMI) shields. The potential advantages of conductive polymers over metals are their light weight, mechanical properties, stability against corrosion, and less expensive synthesis and processing methods.

Conductive polymers can roughly be divided into two different groups:

1. Filled conductive polymers, in which a conductive filler, e.g. carbon black, carbon fibers, metal powder, or the like, is added to a thermosetting resin or thermoplastic resin.

2. Internally conductive polymers, which are themselves electrically active after an oxidation or a reduction (=doping).

The electrical conductivity of filled conductive polymers is dependent on the mutual contact of the filler particles. Usually, about 10 to 50% by weight of well dispersed filler is needed to obtain well conductive composites. Such composites involve, however, many problems: the mechanical properties of the composites worsen crucially as the filler concentration increases, the conductivity is difficult to control, especially within the semiconductor range, and homogeneous dispersing of the filler into the matrix plastic is difficult.

Internally conductive polymers can be prepared from organic polymers having long chains of conjugated double bonds. The stable -electron systems in the double bonds can be disturbed by adding certain doping agents or dopants, which are either electron receivers or donors, to the polymer. Openings or extra electrons are thereby created in the polymer chain, which make possible the electric conduction along the conjugated chain.

An advantage of the internally conductive polymers is the easy versability of the conductivity as a function of the doping time. This is clearly apparent especially with small conductivities. It is difficult to obtain low conductivities with filled polymers. Polyacetylene, poly-p-phenylene, polypyrrole, polythiophene, and polyaniline are examples of internally conductive polymers.

Yet, the processing and stability properties of most internally conductive polymers do not, so far, permit their use in the applications mentioned.

It is to be expected that if it were possible to prepare a homogeneous plastic composite comprising an internally conductive polymer (which would serve as the conductor) and a matrix plastic (which would give the composite the required mechanical etc. properties), it would be possible to prepare a composite having superior properties as compared with the above-mentioned filled, conducting plastic composites.

Conductive composites, in which one component of the composite is an internally conductive polymer, are prior known. Polyacetylene is polymerized into a polyethylene film impregnated with a catalyst /M. E. Galvin and G. E. Wnek, Polym. Commun., 23, (1982), 795/.

Polypyrrole can be electrochemically polymerized onto a plastic matrix, whereby an electrically conductive composite is obtained the mechanical properties of which are better than the mechanical properties of pure polypyrrole (S. E. Lindsey and G. P. Street, Synthetic Metals, 10:67, 1985). Polypyrrole has also been used as the conductive component in polypyrrole-cellulose composites (R. B. Björklund and I. Lundström, Electronic Materials, Vol. 13 No. 1, 1984, pp. 211–230, and DE Patent Application 33 21 281). By diffusing a pyrrole monomer or an aniline monomer into a matrix polymer, whereafter the impregnated matrix polymer is treated with an oxidant such as iron(III) chloride, $FeCl_3$, a conductive plastic composite is obtained (U.S. Pat. No. 4,604,427, 1986), in which polypyrrole or polyaniline serves as the electric conductor.

The melt-processed plastic composite has, however, the drawback that the molecules of the matrix polymer and the conductive polymer are not intertwined. Hereby each matrix molecule forms in a way an insulating particle preventing the molecule chains of the conductive polymer to transmit the charges forth in the composite material.

The aim of the invention is to provide a very homogeneous composite which can be well processed in molten state. Furthermore, such a composite is aimed at whose conductivity can be regulated precisely and readily even to higher conductivities. The structure of the composite must be such as to maintain its homogeneity even in hard processing circumstances utilizing a solution or the molten state.

The above-mentioned aims have now been reached by a new kind of conductive plastic composite. It has been realized that a more homogeneous, stable and conductive plastic composite can be provided by dissolving an internally conductive polymer in a matrix polymer and subsequently polymerizing the matrix monomer to a matrix polymer. The composition thus obtained is more homogeneous than a composite mixed in the molten state. The good homogeneity of the composition prepared by this method can also be noted therethrough that its conductivity in regard to the amount of the conductive polymer contained therein is very high.

The conductive polymer can be any internally conductive polymer which is soluble, partially soluble or insoluble in the matrix monomer or monomer mixture. Preferably, however, the internally conductive polymer is soluble in the matrix monomer. If the internally conductive polymer is insoluble in the matrix monomer, it does not precipitate until the matrix polymer is produced and this ensures that the composition is homogeneous also in micro and molecular scale and that the conductivity of the composition is high. Also when the internally conductive polymer is insoluble in the monomer of the matrix plastic a better homogeneity is in certain cases reached by the method of the present invention than if the polymers would have been mixed in molten state. In this case the internally conductive polymer must, however, be in the form of very finely-divided powder.

The amount in percentages of the internally conductive polymer in the final product depends on the application i.e. which is the conductivity needed in the product. The conductive plastic composite obtained after the polymerization contains preferably 0.1 to 50% by weight of internally conductive polymer. A preferable internally conductive polymer is a thermoplastic poly(3-substituted thiophene). Particularly preferable poly(3-substituted thiophene) is poly(3-alkylthiophene). The most preferable internally conductive polymer is a poly(3-alkylthiophene) having in its alkyl at least about 4 carbon atoms.

The choice of matrix monomer is affected besides by the mechanical etc. properties of the matrix polymer also by the monomer's ability to dissolve or disperse the internally conductive polymer mentioned. Moreover, the monomer must be able to polymerize in the presence of a conductive polymer.

We list in the following the most usual matrix monomers that can be polymerized according to the above-mentioned invention in the presence of a preferred internally conductive poly(3-substituted thiophene) and polymerization methods of these monomers.

the polymerization of styrene with a radical mechanism in suspension, emulsion or as mass polymerization. As comonomers can act e.g. acrylonitrile, methacrylonitrile, 1,2-butadiene, vinyl esters, acrylic esters, methacrylic esters, maleic anhydride, alpha-methyl styrene, divinylbenzene, acrylamide, methacrylamide and/or vinyl halides, such as vinyl chloride, the polymerization of vinyl chloride using radical mechanism in suspension or emulsion. As comonomers can act e.g. vinyl esters, alpha-olefins, vinylidene chloride, acrylic and methacrylic esters, vinyl ethers, acrylonitriles, maleic acid esters and/or fumaric acid esters, other monomers which can be polymerized with radical mechanisms are e.g. ethylene (polymerization in solution or suspension, whereby e.g. vinyl acetate can act as comonomer), vinyl acetate, acrylic and methacrylic acids and esters, acryl amide and acrylonitrile, polymers prepared by step polymerization in solution or bulk, such as polyester, polyamide, polyurethane, and polysiloxane.

If the polymerization of monomer in the presence of the abovementioned poly(3-substituted thiophene) is carried out with a radical mechanism, compounds, such as azocompounds and peroxides, known in connection with the radical polymerization can be used as initiators. The homogeneity and the phase stability of e.g. poly(3-substituted thiophene) and the composition of the other polymer can be improved e.g. by using dibenzoylperoxide or dicumylperoxide, since hereby a part of the polymer produced will be branched to the poly(3-substituted thiophene).

The doping of the polymer composite or a separate internally conductive polymer component with electron donors or acceptors can be done either chemically or electrochemically. It is advantageous to treat the polymer composite with a medium containing $FeCl_3$. The medium may be a suitable organic solvent, e.g. nitromethane or any other solvent or suspension medium which does not have a detrimental effect on the doping process by, for example, dissolving the internally conductive polymer such as poly(3-substituted thiophene). Usually it is possible to use organic solvents which dissolve the salt in question and at the same time cause the matrix plastic to swell and render the doping possible.

After the doping, the obtained product is washed clean of excess dopant with a suitable solvent, preferably with the solvent used in the doping, after which the composite is dried.

Another advantageous dopant is iodine, which is used as such for increasing the conductivity of a conducting polymer like poly(3-substituted thiophene).

The conductivity properties of the doped polymer composite can be regulated by adjusting the dopant concentration, the doping period, the temperature, and the amount of the internally conductive polymer in the composite. Advantageously these parameters are adjusted so that the conductivity of the plastic composite is in the range $10^{-10}-100 S/cm$.

The conductive plastic composite prepared in above-described manner can be easily processed further by using prior-known plastic melt processes, such as e.g. extrusion, injection moulding, compression moulding or film blowing.

The present invention also relates to the use of the abovementioned conductive plastic composites in applications, where conductivity properties are needed. Of these applications the EMI or electromagnetical interference shielding (e.g. in computers) and ESD or antistatic protection (e.g. in antistatic packaging materials and various coatings) can be mentioned.

It is known that the conjugated double bonds in the internally conductive polymer of the conductive plastic composite disclosed in the present invention are electrically conductive when they have been made instable by means of a dopant. On the other hand, it is also known that polyconjugated double bonds cause strong colouring. Thus, the internally conductive polymer contained in the polymer composite according to the invention can also act as a dyestuff in the composite.

Some working examples are presented in the following to illustrate the invention.

EXAMPLE 1

Poly(3-octylthiophene) was prepared by polymerizing 2.5-di-iodated 3-octylthiophene by Grignardization (EP 203,438, 1986, Allied Corporation) or by oxidizing 3-octylthiophene with ferric chloride (JP 63,264,642, 1988b, Mitsui Toatsu Chemicals).

1 part of POT was dissolved in 99 parts of styrene by mixing for 1 hour in a reactor of two liters. After that 395 parts of water (1185g) having the temperature of 80° C. and the stabilizers were added. Benzonate and gelatin was used as the stabilizing system. 0.13 parts of bentonite, 0.13 parts of gelatin, 0.063 parts of sodium acetate and 0.23 parts of 9.25% hydrochlorid acid were added. 0.31 parts of benzoyl peroxide and 0.20 parts of dicumyl peroxide were used as the initiator.

The polymerization was carried out at 90° C. for 5 hours and at 140° C. for 3 hours. The product was washed and dried. Further a 0.5 mm thick sheet was warm-pressed from it at 180° C. The sheet obtained was transparent and reddish in colour.

EXAMPLE 2

The method of proceeding was the same as in Example 1, except that the amount of POT was 10 parts and the amount of styrene was 90 parts. The stabilizers were calcium phosphate (4.8 parts) and potassium peroxysulphate (2.1 parts). The melt pressed (180° C.) product was dark red.

EXAMPLE 3

The composite sheet obtained in Example 2 was doped with iodine (gas phase, vacuum) and the conductivity was 0.1 S/cm.

We claim:

1. A conductive plastic composition made by the process comprising:
   a) dissolving from 0.1 to 50 percent by weight of a conductive poly(3-substituted thiophene) polymer in to a matrix monomer in liquid state, said matrix monomer being styrene;
   b) polymerizing said matrix monomer into a matrix polymer by a polymerization process selected from the group consisting of suspension, emulsion and mass polymerization.

2. The composition of claim 1 wherein said matrix monomer is polymerized with a comonomer(s) selected from the group consisting of: acrylonitrile, methacrylonitrile, 1,2-butadiene, vinyl esters, acrylic esters, methacrylic esters, maleic anhydride, alpha-methyl styrene, divinylbenzene, acrylamide, methacrylamide, and vinyl halides.

3. The conductive plastic composition of claim 1, which has been brought into conductive form by doping the conductive polymer with iodine or ferric chloride.

4. The conductive plastic composition of claim 1 wherein the poly(3-substituted thiophene) is a poly(3-alkyl thiophene).

5. A conductive plastic composite of claim 1, characterized in that its conductivity is within the range of $10^{-10} - 100$ S/cm.

6. A conductive plastic composition of claims 1, 2, 3 or 4. characterized in that it has been further melt processed by using extrusion molding, injection molding, compression molding or blown extrusion.

7. A conductive plastic composite of claims 1, 2, 3 or 4, characterized in that the internally conductive polymer contained therein also acts as a dyestuff.

8. A conductive plastic composition made by the process comprising:
   a) dissolving from 0.1 to 50 percent by weight of a conductive poly(3-substituted thiophene) polymer in to a matrix monomer in liquid state, said monomer being vinyl chloride;
   b) polymerizing said matrix monomer in to a matrix polymer by a polymerization process selected from the group consisting of suspension or emulsion polymerization.

9. The composition of claim 8 wherein said matrix monomer is polymerized with a comonomer(s) selected from a group consisting of: vinyl esters, alpha-olefins, vinylidene chloride, acrylic and methacrylic esters, acrylonitriles, maleic acid esters and fumaric acid esters.

10. The conductive plastic composition of claim 8, which has been brought into conductive form by doping the conductive polymer with iodine or ferric chloride.

11. The conductive plastic composition of claim 8 wherein the poly(3-substituted thiophene) is a poly(3-alkyl thiophene).

12. A conductive plastic composite of claim 8, characterized in that its conductivity is within the range of $10^{-10} - 100$ S/cm.

13. A conductive plastic composition of claims 8, 9, 10 and 11, characterized in that it has been further melt processed by using extrusion molding, injection molding, compression molding or blown extrusion.

14. A conductive plastic composite of claims 8, 9, 10 and 11, characterized in that the internally conductive polymer contained therein also acts as a dyestuff.

15. A conductive plastic composition made by the process comprising:
   a) dissolving from 0.1 to 50 percent by weight of a conductive poly(3-substituted thiophene) polymer in to a matrix monomer in liquid state, said matrix monomer being a alpha-olefin;
   b) polymerizing said matrix monomer in to a matrix polymer by a polymerization process selected from the group consisting of solution and suspension.

16. The composition of claim 15 wherein said matrix monomer is polymerized with a comonomer selected from the group consisting of vinyl acetate, acrylic and methacrylic acids and esters acryl amide and acrylonitrile.

17. The conductive plastic composition of claim 15, which has been brought into conductive form by doping the conductive polymer with iodine or ferric chloride.

18. The conductive plastic composition of claim 15 wherein the poly(3-substituted thiophene) is a poly(3-alkyl thiophene).

19. A conductive plastic composite of claim 15, characterized in that its conductivity is within the range of $10^{-10} - 100$ S/cm.

20. A conductive plastic composition of claims 15, 16, 17 and 18, characterized in that it has been further melt processed by using extrusion molding injection molding, compression molding or blown extrusion.

21. A conductive plastic composite of claims 15, 16, 17 or 18, characterized in that the internally conductive polymer contained therein also acts as a dyestuff.

22. A conductive plastic composition made by the process comprising:
   a) dissolving from 0.1 to 50 percent by weight of a conductive poly(3-substituted thiophene) polymer into a matrix monomer in liquid state; said matrix monomer selected from monomers that form polymers selected from the group consisting of: polyester, polyamide, polyurethane and polysiloxane;
   b) polymerizing said matrix monomer into a matrix polymer by a polymerization process selected from the group consisting of step polymerization in solution or bulk.

23. The conductive plastic composition of claim 21, which has been brought into conductive form by doping the conductive polymer with iodine or ferric chloride.

24. The conductive plastic composition of claim 21 wherein the poly(3-substituted thiophene) is a poly(3-alkyl thiophene).

25. A conductive plastic composite of claim 21, characterized in that its conductivity is within the range of $10^{-10} - 100$ S/cm.

26. A conductive plastic composition of claims 21, 22, 23 or 24, characterized in that it has been further melt processed by using extrusion molding, injection molding, compression molding or blown extrusion.

27. A conductive plastic composite of claims 21, 22, 23 or 24, characterized in that the internally conductive polymer contained therein also acts as a dyestuff.

* * * * *